United States Patent
Zhao et al.

(10) Patent No.: US 12,158,652 B2
(45) Date of Patent: Dec. 3, 2024

(54) DISPLAY PANEL AND DISPLAY DEVICE (71) Applicant: Guangzhou China Star Optoelectronics Semiconductor Display Technology Co., LTd., Guangdong (CN)

(72) Inventors: Bin Zhao, Guangdong (CN); Juncheng Xiao, Guangdong (CN); Cheng Gong, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 18/194,422

(22) Filed: Mar. 31, 2023

(65) Prior Publication Data
US 2024/0255793 A1 Aug. 1, 2024

(30) Foreign Application Priority Data
Jan. 31, 2023 (CN) .......................... 202310074964.X (51) Int. Cl.
*G02F 1/1335* (2006.01)
*G02F 1/1368* (2006.01)
*H01L 27/12* (2006.01)

(52) U.S. Cl.
CPC ...... *G02F 1/133509* (2013.01); *G02F 1/1368* (2013.01); *H01L 27/1248* (2013.01); *G02F 2201/086* (2013.01); *G02F 2202/10* (2013.01)

(58) Field of Classification Search
CPC ............. G02F 1/1333; G02F 1/133345; G02F 1/1335; G02F 1/133509; G02F 1/133514; G02F 1/133521; G02F 1/1336; G02F 1/1343; G02F 1/1362; G02F 1/136227; G02F 1/1368; G02F 2201/086; G02F 2202/10; H01L 27/1248
See application file for complete search history.

(56) References Cited

U.S. PATENT DOCUMENTS

| | | | |
|---|---|---|---|
| 2013/0242220 A1* | 9/2013 | Chang | H01L 29/7869 257/43 |
| 2016/0026034 A1* | 1/2016 | Nam | G02B 5/3075 349/96 |
| 2016/0093833 A1* | 3/2016 | No | H10K 59/8722 438/31 |
| 2016/0139440 A1* | 5/2016 | Shin | B01J 21/063 349/58 |

FOREIGN PATENT DOCUMENTS

KR 20080001999 A * 1/2008 ............. H05B 33/22

OTHER PUBLICATIONS

Patent Translate KR 20080001999.*

* cited by examiner

*Primary Examiner* — Thoi V Duong
(74) *Attorney, Agent, or Firm* — PV IP PC; Wei Te Chung (57) ABSTRACT

The present application discloses a display panel and a display device. In the display panel, a first substrate includes a substrate and a thin-film transistor disposed on the substrate, and the thin-film transistor includes an active layer. The second substrate is disposed on the first substrate. The liquid crystal layer is disposed between the first substrate and the second substrate. The first filter layer is disposed on at least one of the first substrate and the second substrate, and at least part of the first filter layer overlaps with the active layer. The first filter layer is a metal oxide film layer.

20 Claims, 5 Drawing Sheets

DISPLAY PANEL AND DISPLAY DEVICE

FIELD OF INVENTION

The present application relates to a field of display technology, in particular to a display panel and a display device.

DESCRIPTION OF PRIOR ART

A display panel includes an array substrate, the array substrate includes thin-film transistors.

At present, a light stability of the thin-film transistors is poor, and negative shift of a threshold voltage is easy to occur under illumination, resulting in poor stability of display panels.

Therefore, it is necessary to propose a new technical solution to improve the lighting stability of the prior display panels.

SUMMARY

Embodiments of the present application provide a display panel and a display device for improving a lighting stability of the display panel.

The embodiments of the present application provides a display panel, including:
- a first substrate including a substrate and a thin-film transistor disposed on the substrate, the thin-film transistor including an active layer;
- a second substrate disposed on the first substrate;
- a liquid crystal layer disposed between the first substrate and the second substrate; and
- a first filter layer disposed on at least one of the first substrate and the second substrate, and at least part of the first filter layer overlapping with the active layer, wherein the first filter layer is a metal oxide layer.

Optional, in some embodiments provided by the present application, the first filter layer is disposed on a side of the second substrate away from the first substrate.

Optional, in some embodiments provided by the present application, the first filter layer is disposed on a side of the substrate away from the active layer.

Optional, in some embodiments provided by the present application, the display panel further includes a second filter layer, the second filter layer is disposed on a side of the second substrate away from the first substrate, at least part of the second filter layer overlaps with the active layer, and the second filter layer is a metal oxide layer.

Optional, in some embodiments provided by the present application, a material of the first filter layer and a material of the second filter layer both include a semiconductor material.

Optional, in some embodiments provided by the present application, a band-gap of the first filter layer and a band-gap of the second filter layer are both less than 3.5 eV.

Optional, in some embodiments provided by the present application, a material of the first filter layer and a material of the second filter layer both include zinc oxide.

Accordingly, the embodiments of the present application also provides a display device, the display device includes a backlight module and the display panel defined above, and the backlight module is disposed on a side of the display panel.

Accordingly, the embodiments of the present application also provides a display pane, including:
- a first substrate including a substrate and a thin-film transistor disposed on the substrate, the thin-film transistor including an active layer;
- a light-emitting element disposed on the first substrate;
- an encapsulation layer disposed on a side of the light-emitting element away from the first substrate; and
- a first filter layer disposed on at least one of the first substrate and the encapsulation layer, and at least part of the first filter layer overlapping with the active layer, wherein the first filter layer is a metal oxide layer.

Optional, in some embodiments provided by the present application, the first filter layer is disposed on a side of the encapsulation layer away from the first substrate.

Optional, in some embodiments provided by the present application, the first filter layer is disposed on a side of the substrate away from the active layer.

Optional, in some embodiments provided by the present application, the display panel further includes a second filter layer, the second filter layer is disposed on a side of the encapsulation layer away from the first substrate, at least part of the second filter layer overlaps with the active layer, and the second filter layer is a metal oxide layer.

Optional, in some embodiments provided by the present application, a material of the first filter layer and a material of the second filter layer both include a semiconductor material.

Optional, in some embodiments provided by the present application, a band-gap of the first filter layer and a band-gap of the second filter layer are both less than 3.5 eV.

Optional, in some embodiments provided by the present application, the material of the first filter layer and the material of the second filter layer both include zinc oxide.

The present application provides a display panel and a display device. The display panel includes a first substrate, a second substrate, a liquid crystal layer, and a first filter layer. The first substrate includes a substrate and a thin-film transistor disposed on the substrate. The thin-film transistor includes an active layer. The second substrate is disposed on the first substrate. The liquid crystal layer is disposed between the first substrate and the second substrate. The first filter layer is disposed on at least one of the first substrate and the second substrate, and at least part of the first filter layer overlaps the active layer. The first filter layer is a metal oxide layer. In the present application, the first filter layer is disposed on at least one of the first substrate and the second substrate. Because the first filter layer and the active layer overlap, the metal oxide film layer can absorb ultraviolet light when external light is directed to the active layer, and visible light directed to the active layer is not enough to excite the active layer to generate photo-generated electrons. Therefore, a threshold voltage of the thin-film transistor will not drift negatively under illumination. Thus, a lighting stability of the display panel is improved.

DETAILED DESCRIPTION OF PREFERRED EMBODIMENTS

In order to make the objective, technical solution and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure and should not be construed to limit the other specific embodiments which are not described in detail herein. The word "embodiment" configured in this specification means an example, example, or illustration.

The present application provides a display panel. The display panel includes a first substrate, a second substrate, a liquid crystal layer, and a first filter layer. The first substrate includes a substrate and a thin-film transistor disposed on the substrate. The thin-film transistor includes an active layer. The second substrate is disposed on the first substrate. The liquid crystal layer is disposed between the first substrate and the second substrate. The first filter layer is disposed on at least one of the first substrate and the second substrate, and at least part of the first filter layer overlaps the active layer. The first filter layer is a metal oxide layer. In the present application, the first filter layer is disposed on at least one of the first substrate and the second substrate. Because the first filter layer and the active layer overlap, the metal oxide film layer can absorb ultraviolet light when external light is directed to the active layer, and visible light directed to the active layer is not enough to excite the active layer to generate photo-generated electrons. Therefore, a threshold voltage of the thin-film transistor will not drift negatively under illumination. Thus, a lighting stability of the display panel is improved.

The display panel provided by the present application will be described in detail through specific embodiments.

Figure 1:
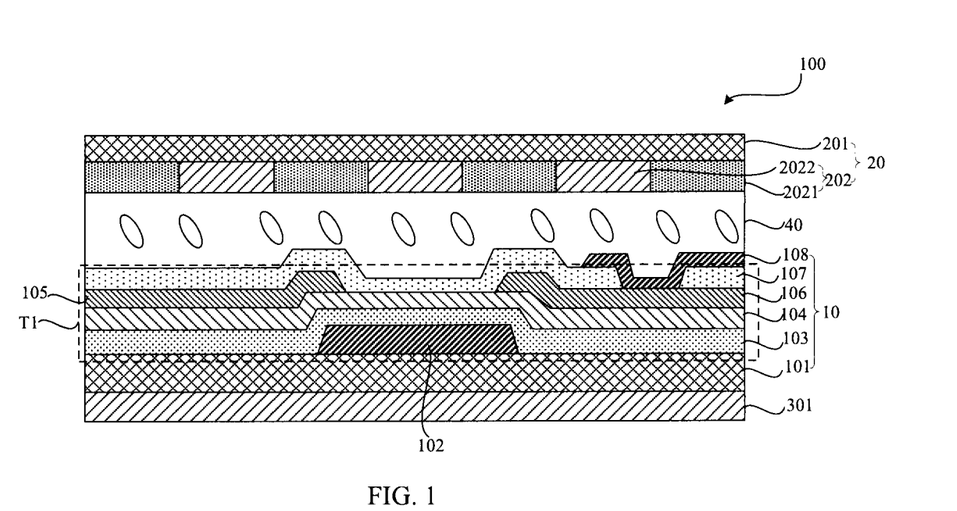
FIG. 1 is a first schematic structural diagram of a display panel provided by embodiments of the present application.

Please refer to FIG. 1, FIG. 1 is a first schematic structural diagram of a display panel provided by embodiments of the present application. The embodiments of the present application provides a display panel 100. The display panel 100 comprises a first substrate 10, a second substrate 20, a liquid crystal layer 40 disposed between the first substrate 10 and the second substrate 20, and a first filter layer 301. The first filter layer 301 is disposed on a side of the first substrate 10 away from the second substrate 20.

In the embodiments of the present application, the first substrate 10 is a driving substrate. The first substrate 10 includes a substrate 101, a gate electrode 102, a gate insulation layer 103, an active layer 104, a source electrode 105, a drain electrode 106, a passivation layer 107, and a first electrode 108. The gate electrode 102, the active layer 104, the source electrode 105, and the drain electrode 106 constitute a thin-film transistor T1.

The gate electrode 102 is disposed on the substrate 101. The substrate 101 may be a glass substrate 101. A material of the gate electrode 102 includes such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), or scandium (Sc), their alloys, their nitrides, etc., or any combination thereof.

The gate insulation layer 103 is disposed on the substrate 101, and the gate insulation layer 103 covers the substrate 101 and the gate electrode 102. In some embodiments, a material of the gate insulating layer 103 can be one or more of silicon oxide, silicon nitride, high dielectric constant dielectric materials (such as alumina, hafnium oxide, zirconia, etc.), and organic dielectric materials.

The active layer 104 is disposed on a side of the gate insulation layer 103 away from the gate electrode 102. A material of the active layer 104 may be one of indium gallium zinc oxide (IGZO), indium gallium tin oxide (IGTO), indium gallium zinc tin oxide (IGTO), or indium gallium zinc tin oxide (IGZTO), or the active layer 104 may also be a low temperature polysilicon active layer or an a-Si active layer.

Oxide thin-film transistors (OTFT) have become a hot spot in the development of thin-film transistors because of its high carrier mobility, low power consumption, and can be applied to low frequency drive. The oxide thin-film transistor refers to the active layer 104 in the thin-film transistor formed by metal oxide semiconductors. The present application uses metal oxide as the material of the active layer 104 to improve the driving ability of the driving substrate.

The source electrode 105 and the drain electrode 106 are disposed on the active layer 104 and connected with the active layer 104. In some embodiments, materials of the source electrode 105 and the drain electrode 106 include one or any combination of metals such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd) or scandium (Sc), their alloys, their nitrides, etc.

The passivation layer 107 is disposed on the source electrode 105 and the electrode drain 106. The passivation layer 107 covers exposed part of the source electrode 105, the drain electrode 106, and the active layer 104. The passivation layer 107 is provided with a first through hole. The first electrode 108 is connected with the drain electrode 106 through the first through hole. In some embodiments, a material of the passivation layer 107 includes at least one of $SiO_x$, $SiN_x$, $SiO_xN_y$, or $AlO_x$.

In the embodiments of the present application, the first electrode 108 is a pixel electrode. A material of the first electrode 108 may be indium tin oxide (ITO).

In the embodiments of the present application, the first filter layer 301 is disposed on a side of the substrate 101 away from the active layer 104. At least part of the first filter layer 301 overlaps with the active layer 104. Further, the first filter layer 301 covers the active layer 102. The first filter layer 301 is a metal oxide film, and the first filter layer 301 is configured to absorb ultraviolet light. In this embodiment, by setting the first filter layer 301 on the side of the active layer 104 away from the substrate 101, at least part of the first filter layer 301 overlaps with the active layer 104. When the external light is directed to the thin-film transistor T1 from the side of the substrate 101, the metal oxide film layer can absorb light in an ultraviolet band, while light in a visible band is not enough to excite the active layer 104 to generate photo-generated electrons, and the threshold voltage of the thin-film transistor T1 will not drift negatively under illumination. Therefore, the display panel 100 provided by the embodiments of the present application can improve the stability of the display panel 100.

Take IGZO as an example, a semiconductor band gap of the IGZO is 3.5 eV, A main reason for a poor light stability of the IGZO is that it is excited by ultraviolet light with a wavelength of λ<354 nm, which continuously generates photo-generated electrons, resulting in a continuous negative drift of the device threshold voltage under illumination. In addition, the visible light received by human eyes from the display panel 100 is mainly visible light, and the ultraviolet light itself will not be recognized by the human eyes. Therefore, the present application mainly improves the stability of the display panel 100 from the perspective of effectively avoiding ultraviolet light from irradiating the active layer 104 without affecting the human eyes' vision.

In the embodiments of the present application, a material of the first filter layer 301 includes semiconductor materials. A band gap of the first filter layer 301 is smaller than a band gap of the active layer 104. Because the first filter layer 301 is a semiconductor material, the band gap of the first filter layer 301 is smaller than the band gap of the active layer 104, so that the first filter layer 301 can absorb light with shorter wavelength than the active layer 104, and avoid the active layer 104 being irradiated by ultraviolet light to produce photo-generated electrons.

The first filter layer 301 is configured to absorb light with wavelength less than 400 nm. For example, the first filter layer 301 is configured to absorb light with a wavelength ranging from 200 nm to 400 nm, or the first filter layer 301 is configured to absorb light with a wavelength ranging from 200 nm to 375 nm, so as to avoid the active layer 104 being exposed to ultraviolet light.

A material of the active layer 102 is a metal oxide (for example, indium gallium zinc oxide (IGZO)). The band gap of the first filter layer 301 and the band gap of the second filter layer 302 are both smaller than a band gap of the metal oxide.

In some embodiments, the band gap of the first filter 301 is less than or equal to 3.5 eV. For example, the band gap of the first filter layer 301 may be selected from any one of 3.5 eV, 3.3 eV, 3.2 eV, 3.0 eV, or 2.9 eV. Since the band gap of the first filter layer 301 is less than or equal to 3.5 eV, it has a good ultraviolet light absorption ability, thus preventing the active layer 104 from being irradiated by ultraviolet light.

In some embodiments, the material of the first light filter 301 may include zinc oxide. For example, the material of the first filter layer 301 may be zinc oxide bulk material or zinc oxide nano material. The first filter layer 301 can be formed on the side of the substrate 101 away from the active layer 104 by evaporation. A band gap of the semiconductor of zinc oxide is about 3.3 eV, and its band gap is smaller than that of IGZO. It is a good ultraviolet light absorber and can absorb ultraviolet light of λ<375 nm. After absorbing the light of λ<375 nm, the remaining visible light is not enough to excite IGZO generates photogenerated electrons, which can effectively improve the light stability of IGZO.

In some embodiments, The first filter layer 301 is overlapped with the active layer 104. Alternatively, The first filter layer 301 is disposed on an entire surface of the substrate 101 away from the active layer 104.

In the embodiments of the present application, the second substrate 20 may be an opposite substrate. Specifically, the second substrate 20 includes a substrate 201 and a color film layer 202 disposed on a side of the substrate 201 near the first substrate 10. The color film layer 202 includes black matrixs 2021 and color blocks 2022 disposed between the black matrixs 2021, wherein the color blocks 2022 include a red color block, a blue color block, and a green color block.

Figure 2:
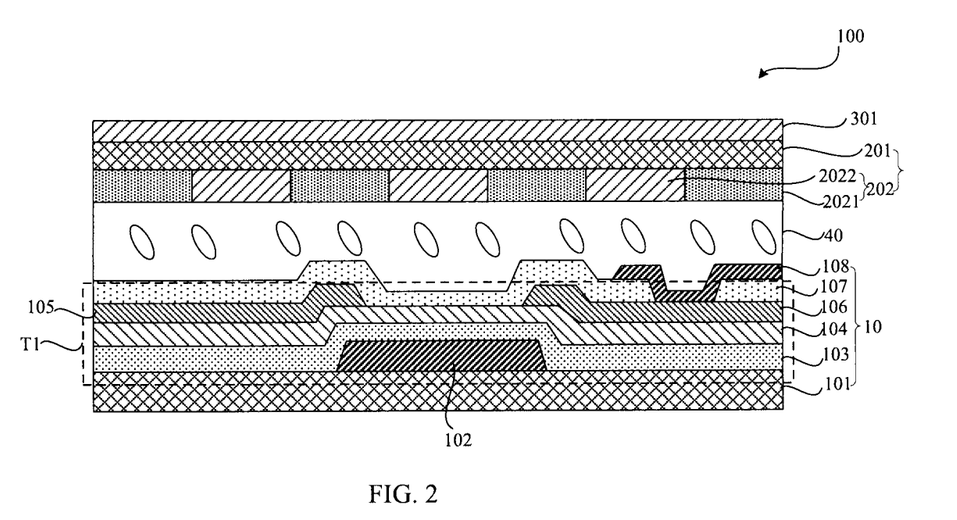
FIG. 2 is a second schematic structural diagram of the display panel provided by the embodiments of the present application.

Please refer to FIG. 2, FIG. 2 is a second schematic structural diagram of the display panel provided by the embodiments of the present application. A difference between the display panel 100 provided in the embodiment of the present application and the display panel 100 provided in FIG. 1 is that the first filter layer 301 is disposed on a side of the second substrate 20 away from the first substrate 10, and at least part of the first filter layer 301 overlaps with the active layer 104. That is to say, in the present application, the first light filter 301 is disposed on a side of the substrate 201 away from the color film 202. The embodiment of the present application is designed to improve the stability of the display panel 100 by disposing the first filter layer 301 on the side of the second substrate 20 away from the first substrate 10 to avoid external light from a side of the second substrate 20 into the thin-film transistor T1.

It should be noted that in some embodiments, the first filter layer 301 is overlapped with the active layer 104. Alternatively, the first filter layer 301 is disposed on an entire surface of the substrate 201 away from the color film layer 202.

Figure 3:
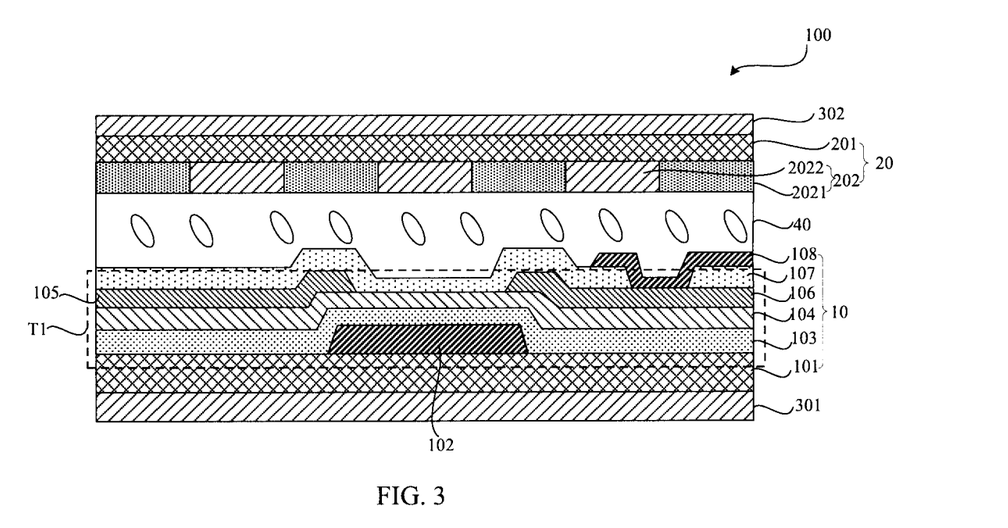
FIG. 3 is a third schematic structural diagram of the display panel provided by the embodiments of the present application.

Please refer to FIG. 3, FIG. 3 is a third schematic structural diagram of the display panel provided by the embodiments of the present application. A difference between the display panel 100 provided in the embodiment of the present application and the display panel 100 provided in FIG. 1 is that the display panel 100 also includes a second light filter layer 302. The second filter layer 302 is disposed on the side of the second substrate 20 away from the first substrate 10, and at least part of the second filter layer 302 overlaps with the active layer 104. The second filter layer 302 is a metal oxide film, and the second filter layer 302 is configured to absorb ultraviolet light. That is to say, in the present application, the second light filter 302 is disposed on the side of the substrate 201 away from the color film 202.

The embodiment of the present application further improves the stability of the display panel 100 by disposing the first filter layer 301 on the side of the substrate 101 away from the active layer 104, and the second filter layer 302 on the side of the substrate 201 away from the color film layer 202, which can prevent ultraviolet light from shooting into the thin-film transistor T1 from a side of the first substrate 10 and a side of the second substrate 20 at a same time.

In the embodiments of the present application, a material of the second filter layer 302 includes semiconductor material. A band gap of the second filter layer 302 is smaller than the band gap of the active layer 104. Because the second optical filter 302 is a semiconductor material, the band gap of the second optical layer is smaller than the band gap of the active layer 104, so that the second optical filter 302 can absorb the light with shorter wavelength than the active layer 104, and avoid the active layer 104 being irradiated by ultraviolet light to produce photo-generated electrons.

In the embodiments of the present application, the second light filter 302 is configured to absorb light with wavelength less than 400 nm. For example, the second light filter 302 is configured to absorb light with a wavelength ranging from 200 nm to 400 nm, or the second light filter 302 is configured to absorb light with a wavelength ranging from 200 nm to 375 nm, so as to avoid the active layer 104 being exposed to ultraviolet light.

In some embodiments, the band gap of the second light filter 302 is less than or equal to 3.5 eV. For example, the band gap of the second light filter 302 may be selected from any one of 3.5 eV, 3.3 eV, 3.2 eV, 3.0 eV, or 2.9 eV. Since the band gap of the second light filter 302 is less than or equal to 3.5 eV, it has a good ultraviolet light absorption ability, thus preventing the active layer 104 from being irradiated by ultraviolet light.

In some embodiments, the material of the second light filter 302 may include zinc oxide. For example, the material of the second light filter 302 may be zinc oxide bulk material or zinc oxide nano material. The second light filter 302 can be formed on the side of the substrate 101 away from the active layer 104 by evaporation.

Figure 4:
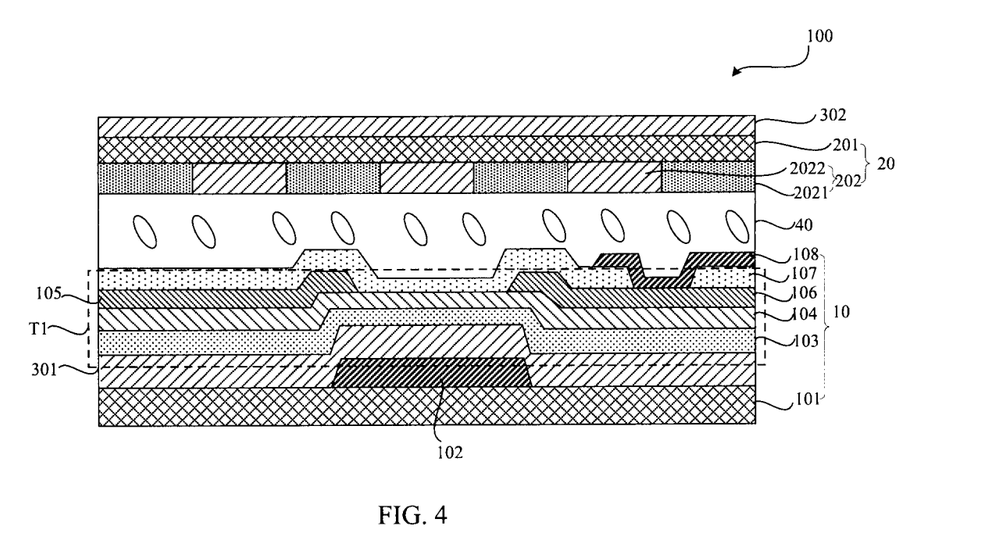
FIG. 4 is a fourth schematic structural diagram of the display panel provided by the embodiments of the present application.

Please refer to FIG. 4, FIG. 4 is a fourth schematic structural diagram of the display panel provided by the embodiments of the present application. A difference between the display panel 100 provided in the embodiment of the present application and the display panel 100 provided in FIG. 4 is that the first filter layer 301 is disposed on a side of the active layer 104 near the substrate 101. In the display panel 100 provided by the present application, because the material of the first filter layer 301 is a semiconductor material, the first filter layer 301 contacts the active layer 104 by disposing the first filter layer 301 on a side of the active layer 104 close to the substrate 101, so the first filter layer 301 can be regarded as a part of the active layer 104. Because semiconductor band gaps of the first filter layer 301 and the active layer 104 are different, when the first filter layer 301 and the active layer 104 are in contact to form a heterojunction, the energy band gap at an interface of the heterojunction changes abruptly. Therefore, a two-dimensional electron gas is formed at the contact interface between the first filter layer 301 and the active layer 104, and the two-dimensional electron gas is restricted to move in a two-dimensional plane, thereby reducing a scattering effect of ionized impurity centers, thus having good transport properties, effectively improving a carrier mobility of the first substrate 10.

Figure 5:
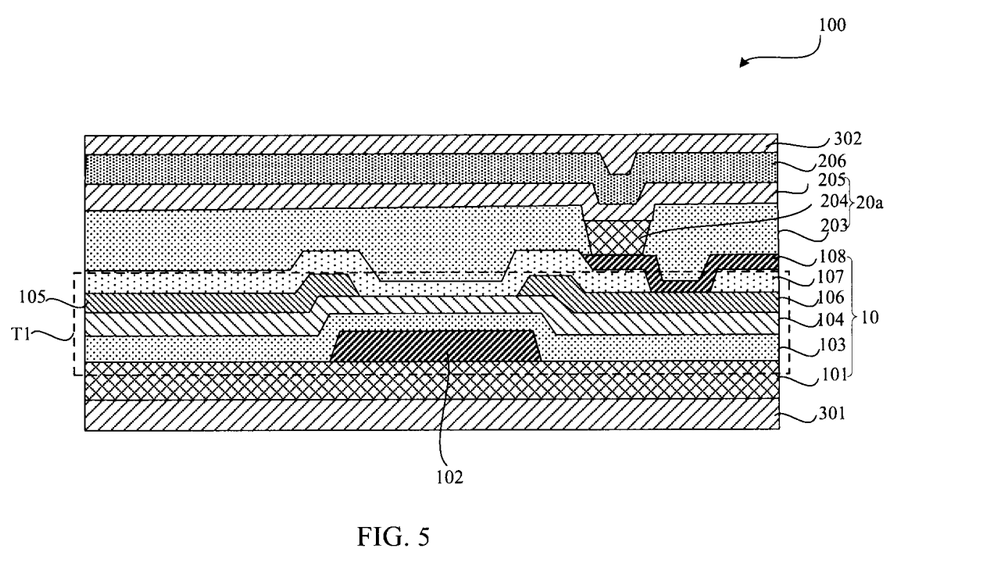
FIG. 5 is a fifth schematic structural diagram of the display panel provided by the embodiments of the present application.

Please refer to FIG. 5, FIG. 5 is a fifth schematic structural diagram of the display panel provided by the embodiments of the present application. The display panel 100 includes the first substrate 10, a light-emitting device 20a, and a encapsulation layer 206. The first filter layer 301 is disposed on at least one of the first substrate 10 and the encapsulation layer 206, and at least part of the first filter layer 301 overlaps with the active layer 102. That is to say, The display panel 100 provided in the embodiment of the present application is an active photodiode display panel. In this embodiment, the light-emitting device 20a includes a pixel definition layer 203, a light-emitting layer 204, a cathode 205, and an encapsulation layer 206. Specifically, the pixel definition layer 203 is provided with an opening that exposes part of a surface of the first electrode 108. The light-emitting layer 204 is disposed in the opening. The cathode 205 is disposed on a whole side of the pixel definition layer 203 away from the first substrate 10. The encapsulation layer 206 is disposed on a side of the cathode 205 away from the pixel definition layer 203. The second filter layer 302 is disposed on the encapsulation layer 206.

The embodiment of the present application further improves the stability of the display panel 100 by disposing the first filter layer 301 on the side of the substrate 101 away from the active layer 104, and the second filter layer 302 on the encapsulation layer 206, which can prevent ultraviolet light from shooting into the thin-film transistor T1 from a side of the first substrate 10 and a side of the second substrate 20 at a same time.

It should be understood that when the first substrate 10 is the driving substrate and the light-emitting device 20a is disposed on the first substrate 10, the display panel 100 is an active light-emitting display panel, such as organic light-emitting diode (OLED) display panel, active matrix organic light-emitting diode (AMOLED) display panel, passive matrix organic light-emitting diode (PMOLED) display panel, quantum dot light-emitting diode (QLED) display panel, micro light-emitting diode (Micro-LED) display panel, and mini light-emitting diode (Mini-LED) display panel.

Figure 6:
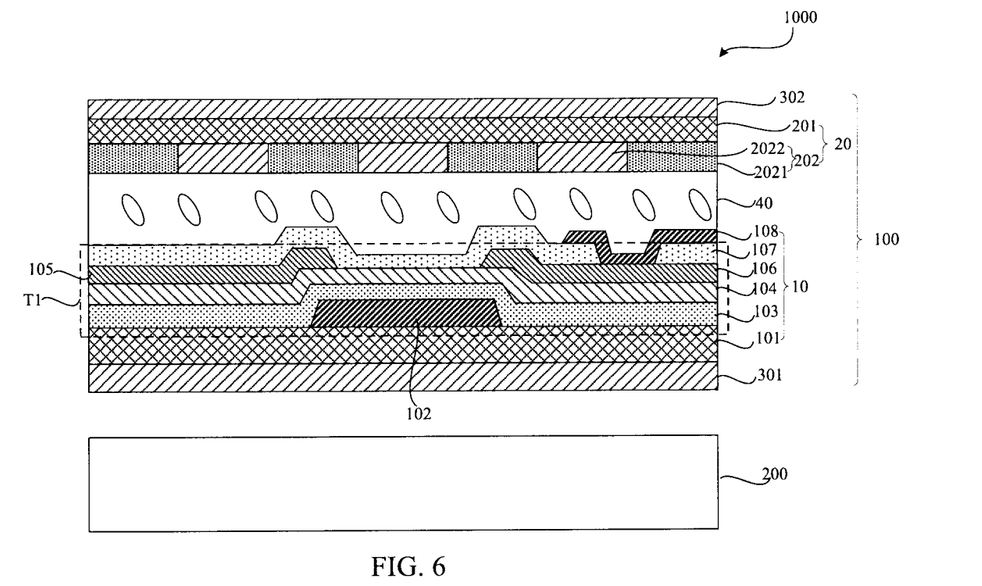
FIG. 6 is a schematic structural diagram of a display device provided by the embodiments of the present application.

Please refer to FIG. 6, FIG. 6 is a schematic structural diagram of a display device provided by the embodiments of the present application. The display device 1000 provided by the present application includes a backlight module 200 and the display panel 100 provided by any embodiment of FIGS. 1 to 4 above. The backlight module 200 is disposed on a side of the display panel 100, and the backlight module 200 is configured to provide backlight light source for the display panel 100.

In the display device 1000 provided by the present application, because the first light filter 301 is disposed on the side of the substrate 101 away from the active layer 104, when the backlight of the backlight module 200 passes through the first light filter 301, it can effectively absorb and filter out the ultraviolet light, thus improving a device performance and extending a service life of the display device 1000.

the display device in the present application may be a smart phone, a tablet personal computer, a mobile phone, a video phone, an e-book reader, a desktop PC, a laptop PC, a netbook computer, a workstation, a server, a personal digital assistant At least one of portable multimedia player, MP3 player, mobile medical machine, camera, game machine, digital camera, vehicle navigator, electronic billboard, automatic teller machine or wearable device.

It should be noted that the display device in the present application may be at least one of a smart phone, a tablet computer, a mobile phone, a video phone, an e-book reader, a desktop computer, a laptop PC, a netbook computer, a workstation, a server, a personal digital assistant, a portable multimedia player, a MP3 player, a mobile medical device, a camera, a game console, a digital camera, a car navigator, an electronic billboard, an automatic teller machine, and a wearable device.

The embodiments of the present application provide the display panel 100 and the display device 1000. The display panel 100 includes a first substrate 10, a second substrate 20, and a first light filter 301. The first substrate 10 includes a substrate 101 and a thin-film transistor T1 disposed on the substrate 101. The thin-film transistor T1 includes an active layer 104. The second substrate 20 is disposed on the first substrate 10. The first filter layer 301 is disposed on at least one of the first substrate 10 and the second substrate 20, and at least part of the first filter layer 301 overlaps the active layer 104. The first filter layer 301 is configured to absorb light with wavelength less than 400 nm. In the present application, the first filter layer 301 is disposed on at least one of the first substrate 10 and the second substrate 20, and the first filter layer 301 overlaps with the active layer 104. When external light is directed to the thin-film transistor T1, the first filter layer 301 can absorb ultraviolet light, while visible light directed to the thin-film transistor T1 is not enough to stimulate the active layer 104 to generate photo-generated electrons, thus improving a lighting stability of the display panel 100.

Figure 7:
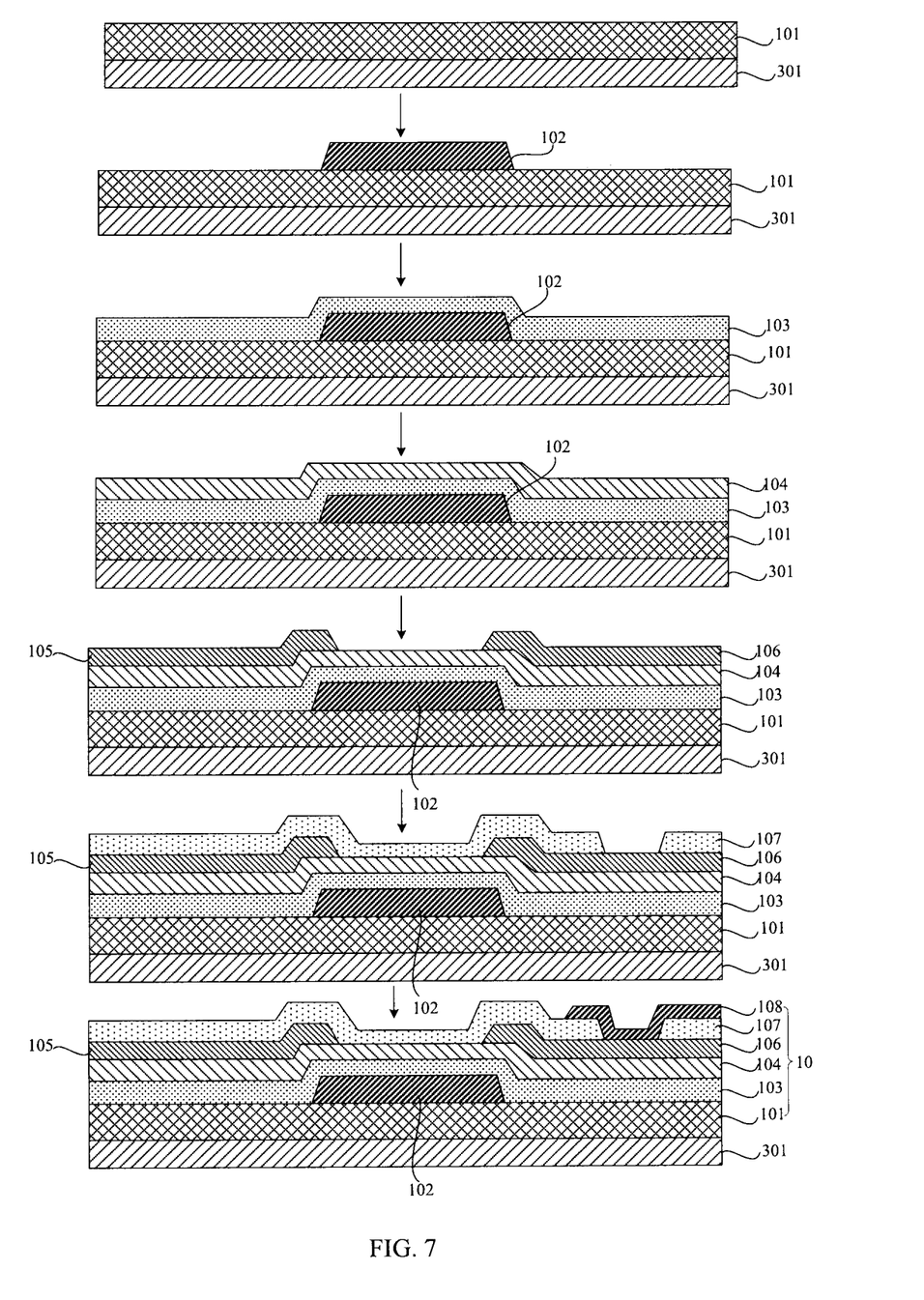
FIG. 7 is a schematic diagram of a manufacturing method of a first substrate of the display panel provided by the embodiments of the present application.
Figure 8:
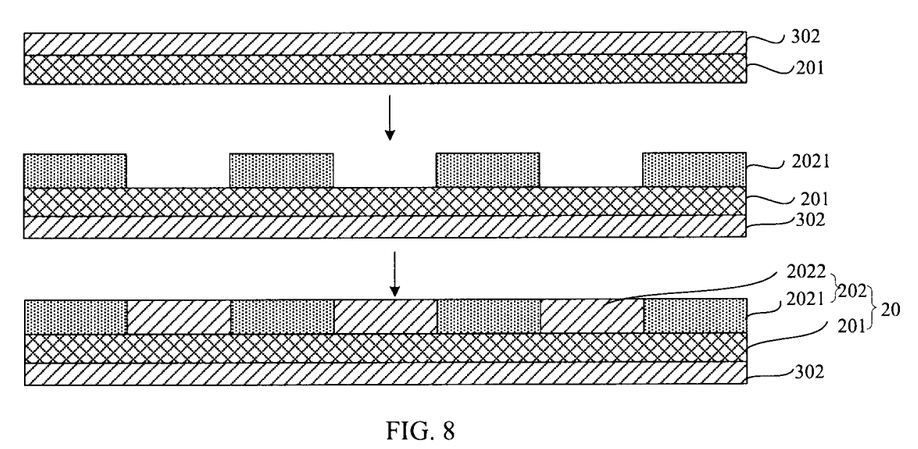
FIG. 8 is a schematic diagram of a manufacturing method of a second substrate of the display panel provided by the embodiments of the present application.

Accordingly, the embodiments of the present application also provides a manufacturing method of a display panel. Please refer to FIGS. 7 and 8. FIG. 7 is a schematic diagram of a manufacturing method of a first substrate of the display panel provided by the embodiments of the present application. FIG. 8 is a schematic diagram of a manufacturing method of a second substrate of the display panel provided by the embodiments of the present application.

Specifically, the manufacturing steps of the first substrate 10 are as follows:

Firstly, providing a substrate 101, and depositing a first filter layer 301 on the substrate 101 by physical vapor deposition.

Secondly, depositing a first metal layer on a side of the substrate 101 away from the first filter layer 301, and patterning the first metal layer to form a gate electrode 102.

Next, forming a gate insulation layer 103 on the gate electrode 102 by chemical vapor deposition.

Subsequently, forming a semiconductor layer on the gate insulating layer 103 by physical vapor deposition. A target material of physical vapor deposition can be IGZO, IGZTO, and IGTO etc.

Subsequently, forming a second metal layer on the semiconductor layer, and patterning the semiconductor layer and the second metal layer to form an active layer 104, a source electrode 105, and a drain electrode 106.

Next, forming a passivation layer 107 on the source electrode 105 and the drain electrode 106 by chemical vapor deposition, and opening the passivation layer 107.

Finally, forming a conductive layer on the passivation layer 107 by physical vapor deposition, and patterning the conductive layer to form a first electrode 108. The first electrode 108 is connected with the drain electrode 106 through an opening to complete the preparation of the first substrate 10.

Specifically, the manufacturing steps of the second substrate 20 are as follows:

Firstly, providing a substrate 201, and depositing a second light filter 302 on the substrate 201 by physical vapor deposition.

Secondly, depositing a black photoresist material on a side of the substrate 201 away from the second filter layer 302, and patterning the black photoresist material to form a black matrix 2021.

Forming a color barrier layer on a side of the substrate 201 away from the second filter layer 302, and the fabrication of the second substrate 20 is completed in turn.

Next, disposing a liquid crystal on the first substrate 10 and aligning the first substrate 10 and the second substrate 20 to form a display panel 100. Please refer to FIG. 3.

To sum up, although the present application has been disclosed as above with preferred embodiments, the above preferred embodiments are not intended to limit the application. Ordinary technicians in the art can make various changes and refinishes without departing from the spirit and scope of the application. Therefore, the scope of protection of the application is subject to the scope defined in the claims.

What is claimed is:

1. A display panel, comprising:
 a first substrate, comprising a base substrate and a thin-film transistor disposed on the base substrate, the thin-film transistor comprising an active layer and a gate;
 a second substrate, disposed opposite to the first substrate;
 a liquid crystal layer, disposed between the first substrate and the second substrate; and
 a first filter layer, disposed between the active layer and the gate, and at least part of the first filter layer overlapping with the active layer, wherein the first filter layer is a metal oxide layer.

2. The display panel according to claim 1, wherein the display panel further comprises a second filter layer, the second filter layer is disposed on a side of the second substrate away from the first substrate, at least part of the second filter layer overlaps with the active layer, and the second filter layer is a metal oxide layer.

3. The display panel according to claim 2, wherein a material of the first filter layer and a material of the second filter layer both comprise a semiconductor material.

4. The display panel according to claim 2, wherein a band-gap of the first filter layer and a band-gap of the second filter layer are both less than 3.5 eV.

5. The display panel according to claim 4, wherein a material of the first filter layer and a material of the second filter layer both comprise zinc oxide.

6. The display panel according to claim 1, wherein the first filter layer is continuously arranged throughout the layer.

7. The display panel according to claim 1, wherein an orthographic projection of the active layer on the base substrate completely falls within an orthographic projection of the first filter layer on the base substrate.

8. A display device, comprising a backlight module and a display panel, the backlight module disposed on a side of the display panel, the display panel comprising:
 a first substrate, comprising a base substrate and a thin-film transistor disposed on the base substrate, the thin-film transistor comprising an active layer and a gate;
 a second substrate, disposed opposite to the first substrate;
 a liquid crystal layer, disposed between the first substrate and the second substrate; and
 a first filter layer, disposed between the active layer and the gate, and at least part of the first filter layer overlapping with the active layer, wherein the first filter layer is a metal oxide layer.

9. The display device according to claim 8, wherein the display panel further comprises a second filter layer, the second filter layer is disposed on a side of the second substrate away from the first substrate, at least part of the second filter layer overlaps with the active layer, and the second filter layer is a metal oxide layer.

10. The display device according to claim 9, wherein a material of the first filter layer and a material of the second filter layer both comprise a semiconductor material.

11. The display device according to claim 9, wherein a band-gap of the first filter layer and a band-gap of the second filter layer are both less than 3.5 eV.

12. The display device according to claim 8, wherein the first filter layer is continuously arranged throughout the layer.

13. The display device according to claim 8, wherein an orthographic projection of the active layer on the base substrate completely falls within an orthographic projection of the first filter layer on the base substrate.

14. A display panel, comprising:
 a first substrate, comprising a base substrate and a thin-film transistor disposed on the base substrate, the thin-film transistor comprising an active layer and a gate;

a light-emitting element, disposed on the first substrate;

an encapsulation layer, disposed on a side of the light-emitting element away from the first substrate; and a first filter layer, disposed between the active layer and the gate, and at least part of the first filter layer overlapping with the active layer, wherein the first filter layer is a metal oxide layer.

15. The display panel according to claim 14, wherein the display panel further comprises a second filter layer, the second filter layer is disposed on a side of the encapsulation layer away from the first substrate, at least part of the second filter layer overlaps with the active layer, and the second filter layer is a metal oxide layer.

16. The display panel according to claim 15, wherein a material of the first filter layer and a material of the second filter layer both comprise a semiconductor material.

17. The display panel according to claim 15, wherein a band-gap of the first filter layer and a band-gap of the second filter layer are both less than 3.5 eV.

18. The display panel according to claim 15, wherein the material of the first filter layer and the material of the second filter layer both comprise zinc oxide.

19. The display panel according to claim 14, wherein the first filter layer is continuously arranged throughout the layer.

20. The display panel according to claim 14, wherein an orthographic projection of the active layer on the base substrate completely falls within an orthographic projection of the first filter layer on the base substrate.

\* \* \* \* \*